(12) United States Patent
Kung et al.

(10) Patent No.: US 6,197,613 B1
(45) Date of Patent: Mar. 6, 2001

(54) WAFER LEVEL PACKAGING METHOD AND DEVICES FORMED

(75) Inventors: Ling-Chen Kung, Hsinchu; Tsung-Yao Chu, Taipei, both of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/274,611

(22) Filed: Mar. 23, 1999

(51) Int. Cl.$^7$ ............... H01L 21/44; H01L 21/48; H01L 21/50

(52) U.S. Cl. ............... 438/106; 438/612; 438/613; 438/614; 438/618

(58) Field of Search .................... 438/106, 107, 438/108, 612, 613, 614, 618

(56) References Cited

U.S. PATENT DOCUMENTS 5,851,911 * 12/1998 Farnworth ............... 438/614
6,050,832 * 4/2000 Lee et al. ............... 439/91

* cited by examiner

Primary Examiner—Matthew Smith
Assistant Examiner—Craig P. Lytle
(74) Attorney, Agent, or Firm—Tung & Associates

(57) ABSTRACT

The present invention discloses a method for forming a wafer level package by first providing a silicon wafer that has a multiplicity of IC dies formed on a top surface, each of the IC dies has at least one peripheral I/O pad formed in an insulating layer, then forming at least one via plug of a conductive metal with a top surface exposed on the at least one peripheral I/O pad, then coating a layer of an insulating material that has sufficient elasticity on the surface of the wafer prior to the deposition and forming of a metal trace on the elastic material layer, at least one area array I/O pad is then formed at an opposite end of the metal trace with a solder bump formed on the I/O pad before they are reflowed into a solder ball. The elastic material layer deposited under the metal traces acts as a stress-buffing layer such that an IC circuit of high reliability can be produced on a wafer level for the low cost fabrication of IC assembly.

18 Claims, 4 Drawing Sheets

WAFER LEVEL PACKAGING METHOD AND DEVICES FORMED

FIELD OF THE INVENTION

The present invention relates generally to a method for forming a wafer level package and devices formed and more particularly, relates to a method for forming a wafer level package in which metal traces are formed on an insulating IC elastomeric layer for I/O redistribution from a peripheral array to an area array on a plurality of IC chips on the wafer and devices formed by the method.

BACKGROUND OF THE INVENTION

In the fabrication of modern semiconductor devices, the ever increasing device density and decreasing device dimensions demand more stringent requirements in the packaging or interconnecting techniques of such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become impractical for several reasons. One of the problems in utilizing solder paste screening technique in bonding modern semiconductor devices is the paste composition itself. A solder paste is formed by a flux material and solder alloy particles. The consistency and uniformity of the solder paste composition become more difficult to control as the solder bump volume decreases. Even though a solution of the problem has been proposed by using solder paste that contain extremely small and uniform solder particles, it can only be achieved at a high cost penalty. A second problem in utilizing the solder paste screening technique in modern high density semiconductor devices is the available space between solder bumps. It is known that a large volume reduction occurs when a solder changes from a paste state to a cured stated, the screen holes for the solder paste must be significantly larger in diameter than the actual solder bumps to be formed. The large volume shrinkage ratio thus makes the solder paste screening technique difficult to carry out in high density devices.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A–1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UBM layer 26 improves bonding between a solder ball to be formed and the top surface 18 of the bond pad 14.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 μm and about 40 μm, preferably at a thickness of about 35 μm. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

A unique feature of the chip scale package is the use of an interposer layer that is formed of a flexible, compliant material. The interposer layer provides the capability of absorbing mechanical stresses during the package forming steps and furthermore, allows thermal expansion mismatch between the die and the substrate. The interposer layer, therefore, acts both as a stress buffer and as a thermal expansion buffer. Another unique feature of the chip scale package, i.e., such as a micro-BGA package, is its ability to be assembled to a circuit board by using conventional surface mount technology (SMT) processes.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 $\mu$m, is formed of a polymeric material such as polyimide which is laminated to a silicon elastomer layer of approximately 150 $\mu$m thick. The silicon elastomeric layer provides flexibility and compliance in all three directions for relief of stresses and thermal expansion mismatches.

To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

A large number of IC chips are designed with a peripheral array of I/O pads. For modern high density devices, the pitch allowed between I/O pads is steadily decreasing. An I/O pad redistribution process is frequently necessary for changing a peripheral array to an area array in order to improve pitch between the conductive pads. During the redistribution process, metal traces are frequently used to extend bond pads from a peripheral area to a center area on the chip. Due to the limited space available for the metal traces, especially those traces that run an extended distance, it is desirable to produce metal traces that are stress buffered in order to assure the reliability of a chip.

It is therefore an object of the present invention to provide a method for forming a wafer level package that does not have the drawbacks or shortcomings of the conventional methods.

It is another object of the present invention to provide a method for forming a wafer level package that utilizes I/O redistribution on a plurality of IC chips.

It is a further object of the present invention to provide a method for forming a wafer level package wherein an insulating layer deposited of an elastic material is used for stress-buffing to eliminate processing induced stresses on the chip components.

It is another further object of the present invention to provide a method for forming a wafer level package that utilizes a multiplicity of metal traces formed on a stress-buffing insulating layer for connecting I/O pads in a peripheral array to I/O pads in an area array.

It is still another object of the present invention to provide a method for forming a wafer level package wherein a multiplicity of area array I/O pads are formed and a multiplicity of solder balls are planted on the pads.

It is yet another object of the present invention to provide a method for forming a wafer level package that includes a multiplicity of metal traces formed on an insulative, elastic material layer for minimizing processing induced stresses.

It is yet another further object of the present invention to provide a method for forming a wafer level package which includes a multiplicity of IC chips each having metal traces formed on an elastic material layer for the redistribution of peripheral array I/O pads to area array I/O pads.

It is still another further object of the present invention to provide a method for forming a wafer level package wherein an insulative, elastic material layer is provided as a base layer for a multiplicity of metal traces wherein the elastic material has a sufficiently low Young's modulus for functioning as a stress-buffing layer.

SUMMARY OF THE INVENTION

In accordance with the present invention, a method for forming a wafer level package that contains a multiplicity of IC chips each having an I/O redistribution and devices formed by the method are provided.

In a preferred embodiment, a method for forming a wafer level package can be carried out by the steps of providing a silicon wafer which has a multiplicity of IC dies formed on a top surface, each of the multiplicity of IC dies has at least one first I/O pad formed in a first insulating layer, forming at least one via plug of a first conductive metal substantially exposed to the at least one first I/O pad, coating a layer of second insulating material of sufficient elasticity on the top surface of the wafer with a top surface of the at least one via plug substantially exposed from the second insulating material layer, depositing a second conductive metal layer on top of the second insulating material layer, forming at least one metal trace with a first end electrically communicating with the at least one via plug and a second end extending away from the first end, depositing a third insulating material layer on top of the at least one metal trace, defining and exposing at least one second I/O pad at the second end of the at least one metal trace, and forming at least one solder ball on the at least one second I/O pad.

In the method for forming a wafer level package, the step of forming at least one solder ball may further include the step of depositing an under-bump-metallurgy layer on the at least one second I/O pad prior to forming the at least one solder ball. The step of forming at least one solder ball may further include the steps of depositing an under-bump-metallurgy layer on the at least one second I/O pad, filling at least one via hole on the at least one second I/O pad with a solder material forming at least one solder bump, removing the third insulating material layer, and reflowing the at least one solder bump into solder ball. The at least one solder bump may be formed in the at least one via hole by a technique of screen printing, stencil printing, electrodeposition, electroless deposition and pick and place solder ball (or ball planting technique).

In a method for forming a wafer lever package, the second insulating material layer may be formed of an elastic material that has a sufficiently low Young's modulus. The at least one first I/O pad may be arranged in a peripheral array on the multiplicity of IC dies, while the at least one second I/O pad may be arranged in an area array on the multiplicity of IC dies. The at least one second I/O pad may be arranged in an area that is sufficiently away from a periphery of the multiplicity of IC dies. The at least one via plug may be formed by a photolithographic method. The at least one first I/O pad and the at least one second I/O pad may be formed of aluminum or copper. The at least one via plug may be formed of a material such as Al, Cu, Al alloys or Cu alloys. The second conductive metal layer may be formed of Al, Cu or UBM materials.

The present invention is further directed to a wafer level package that includes a silicon wafer which has a multiplicity of IC dies formed on a top surface, each of the multiplicity of IC dies may have at least one first I/O pad formed in a first insulating layer, at least one via plug formed of a first conductive metal substantial exposed on the at least one I/O pad, a second insulating material layer which has a sufficient elasticity on the top surface of the wafer, a top surface of the at least one via plug is substantially exposed from the second insulating material layer, a second conductive metal layer on top of the second insulating material layer, at least one metal trace which has a first end electrically communicating with the at least one via plug and a second end extending away from the first end, a third insulating material layer on top of the at least one metal trace, at least one second I/O pad exposed from the third insulating material layer in electrical communication with the second end of the at least one metal trace, and at least one solder ball positioned on and electrically communicating with the at least one second I/O pad.

In the wafer level package, the at least one solder ball may further include an under-bump-metallurgy layer on the at least one second I/O pad. The second insulating material layer may be an elastomeric material layer. The at least one first I/O pad is arranged in a peripheral array and the at least one second I/O pad may be arranged in an area array.

In an alternate embodiment, a method for forming a wafer level package can be carried out by the operating steps of first providing a silicon wafer which has a multiplicity of IC dies formed on a top surface, each of the multiplicity of IC dies may have at least one I/O pad in a peripheral array formed in a first insulating layer, forming at least one via plug of a first conductive metal substantially exposed on the at least one I/O pad in the peripheral array, coating a layer of second insulating material which has sufficient elasticity on the top surface of the wafer with a top surface of the at least one via plug substantially exposed from the layer of second insulating material, depositing a second conductive metal layer on top of the layer of second insulating material, forming at least one metal trace which has a first end electrically communicating with the at least one via plug and a second end extending away from the first end, depositing a layer of third insulating material on top of the at least one metal trace, defining and exposing at least one I/O pad in an area array in electrical communication with the second end of the at least one metal trace, and forming at least one solder ball on the at least one I/O pad in the area array.

In the method for forming a wafer level package, the step of forming at least one solder ball may further include depositing an under-bump-metallurgy layer on the at least one I/O pad in the area array prior to forming the at least one solder ball. The method may further include the step of coating the layer of second insulating material from an elastomeric material, the step of forming the at least one I/O pad in a peripheral array and in an area array with aluminum or copper, or the step of forming the at least one via plug from a material selected from the group consisting of aluminum, copper, aluminum alloys and copper alloys.

BRIEF DESCRIPTION OF THE DRAWINGS

These objects, features and advantages will become apparent from a close examination of the following specification and the appended drawings in which.

DETAILED DESCRIPTION OF THE PREFERRED EMBODIMENT

The present invention discloses a method for forming a wafer level package that includes the step of coating a layer of insulative material that has sufficient elasticity on a top surface of the wafer with a via plug substantially exposed from the layer, forming metal traces for I/O redistribution from a peripheral array to an area array on top of the elastic material layer, and then forming bond pads and solder balls on the metal traces at an opposite end for forming area array I/O pads.

In a preferred embodiment, the present invention discloses a method for connecting at least one first I/O pad to at least one second I/O pad on an IC chip by forming metal traces on an insulating material layer that has sufficient elasticity for the layer to function as a stress-buffer. In an alternate embodiment, a wafer level package is provided by the present invention method by connecting at least one I/O pad in a peripheral array to a least one I/O pad in an area array by a metal trace that is formed on an insulating material layer which has sufficient elasticity for the layer to act as a stress-buffer.

The invention further discloses a wafer level package that can be fabricated by the present invention novel method such that a multiplicity of metal traces connecting I/O pads from a peripheral array to an area array can be formed on a layer of stress-buffing material such as an elastomeric material deposited on top of the IC dies. The metal traces connect the IC chip through bond pads and via plugs arranged in a peripheral array to an outside circuit through bond pads and solder balls arranged in an area array.

In the method, prior to the formation of solder balls on the bond pads arranged in an area array, an under-bump-metallurgy (UBM) layer on the I/O bond pads is first formed by a deposition and patterning process. The solder balls planted on the opposite ends of the metal traces can be achieved by a low cost technique such as screen printing, stencil printing, electrodeposition, electroless deposition or pick and place (solder ball placement). It is preferred that the insulating elastic material be formed of an elastomer such as a silicone rubber or a fluorosilicone rubber. The elastomeric material preferably has a low Young's modulus that is not larger than 20 MPa. The via plugs may preferably be formed by a photolithographic method and filled with a material such as aluminum, copper, aluminum alloy or copper alloys. The I/O pads may be formed of aluminum or copper.

Figure 1A:
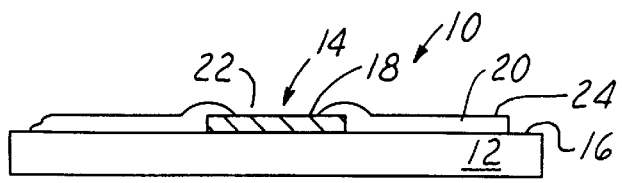
FIG. 1A is an enlarged, cross-sectional view of a conventional pre-processed semiconductor substrate which has a bond pad and a passivation layer formed on top.
Figure 1B:
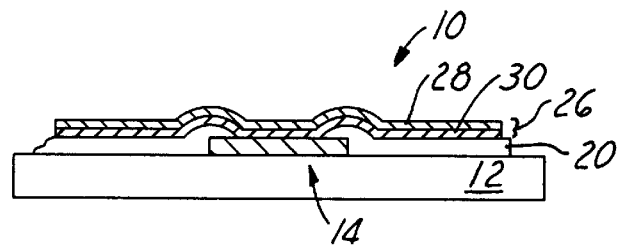
FIG. 1B is an enlarged, cross-sectional view of the conventional semiconductor structure of FIG. 1A which has a ball limiting metallurgy layer formed on top.
Figure 1C:
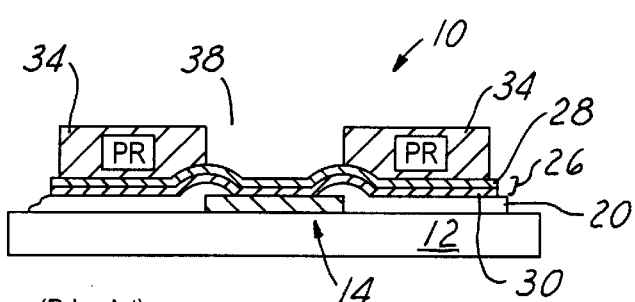
FIG. 1C is an enlarged, cross-sectional view of the conventional semiconductor structure of FIG. 1 with a photoresist layer deposited and defined on top.
Figure 1D:
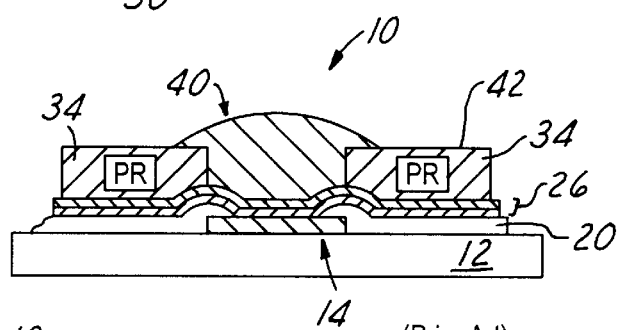
FIG. 1D is an enlarged, cross-sectional view of the conventional semiconductor structure of FIG. 1C with a solder material deposited in the window openings for the solder bump.
Figure 1E:
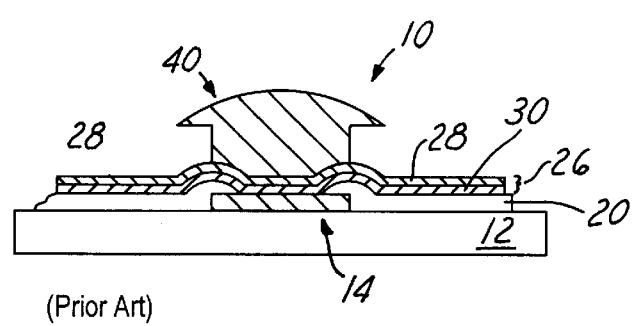
FIG. 1E is an enlarged, cross-sectional view of the conventional semiconductor structure of FIG. 1D with the photoresist layer removed in a wet etching process.
Figure 1F:
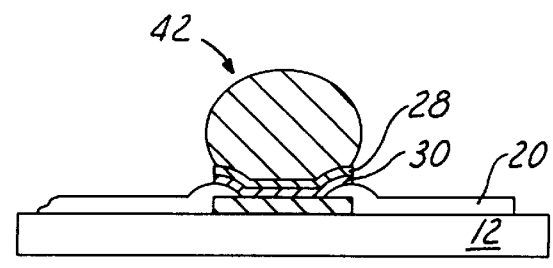
FIG. 1F is an enlarged, cross-sectional view of the conventional semiconductor structure of FIG. 1E with the exposed ball limiting metallurgy layer removed and the solder bump reflowed into a solder ball.
Figure 2A:
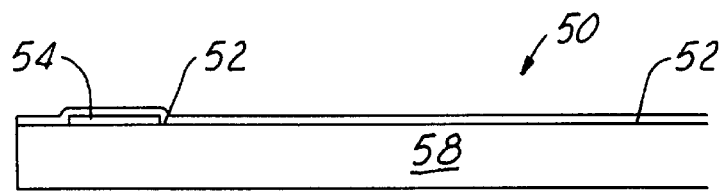
FIG. 2A is an enlarged, cross-sectional view of a present invention wafer that has a bond pad and a passivation layer formed on top.
Figure 2B:
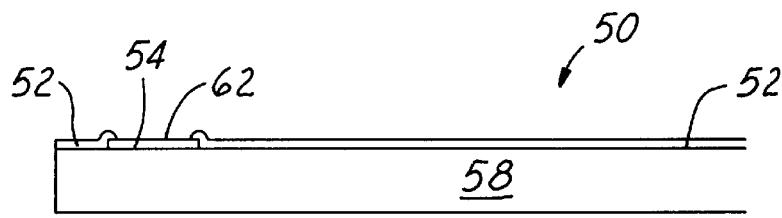
FIG. 2B is an enlarged, cross-sectional view of the present invention wafer of FIG. 2A that has the passivation layer patterned and the bond pad exposed.
Figure 2C:
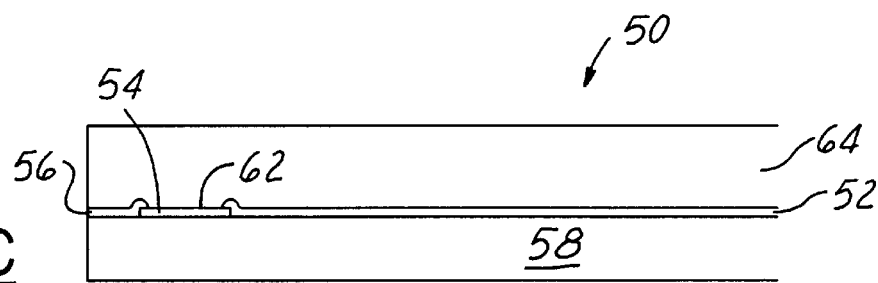
FIG. 2C is an enlarged, cross-sectional view of the present invention wafer of FIG. 2B that has a thick photoresist layer coated on top.
Figure 2D:
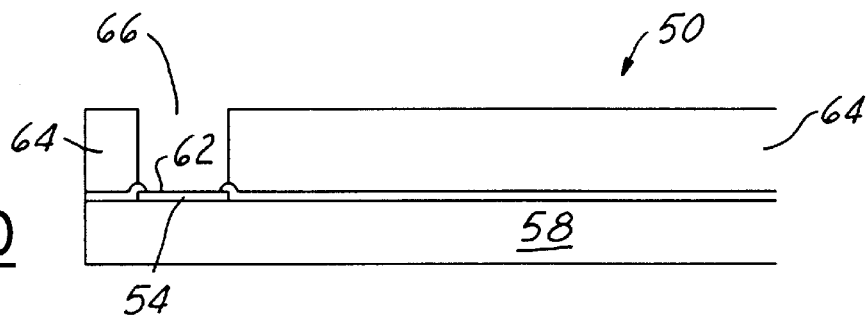
FIG. 2D is an enlarged, cross-sectional view of the present invention wafer of FIG. 2C with the photoresist layer patterned to expose the bond pad.

Referring now to FIG. 2A, wherein a present invention wafer 50 is shown. On a top surface 52 of wafer 50, a bond pad 54 is first formed on a silicon substrate 58 before a dielectric, insulating layer 56 is deposited on top. The bond pad 54 may be formed of a conductive metal such as aluminum or copper. The dielectric layer 56 is then patterned and defined to expose the top surface 62 of the bond pad 54. This is shown in FIG. 2B. On top of the dielectric material layer 56 and the bond pad 54, an organic material layer 64 such as a photoresist or a polyimide is then deposited by a technique of coating, printing or laminating. The organic material layer 64 can be deposited to a thickness between about 25 $\mu$m and about 150 $\mu$m, and preferably between about 75 $\mu$m and about 125 $\mu$m. This is shown in FIG. 1C. The thick organic material layer 64, which is preferably a photo-sensitive material that can be patterned, is then patterned and etched by either a wet etch method or a dry etch method to expose the top surface 62 of the I/O pad 54 by forming a via opening 66. This is shown in FIG. 2D.

Figure 2E:
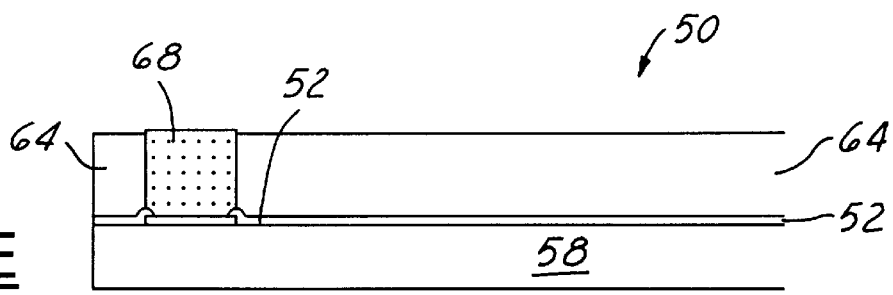
FIG. 2E is an enlarged, cross-section view of the present invention wafer of FIG. 2D having a conductive metal filled up the via opening.
Figure 2F:
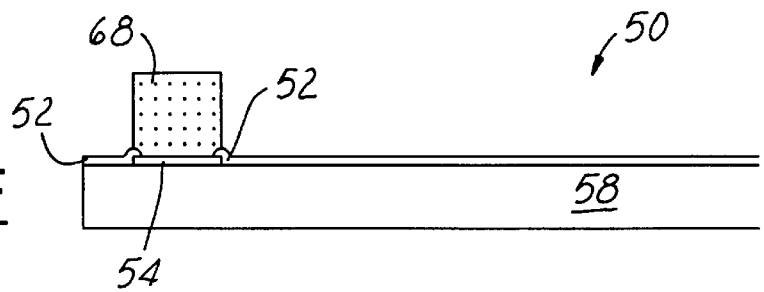
FIG. 2F is an enlarged, cross-sectional view of the present invention wafer of FIG. 2E with the photoresist layer removed in a stripping process.

In the next step of the process, as shown in FIG. 2E, an electroplating or an electroless plating method can be used to fill the via opening 66 with a highly conductive metal such as copper for establishing electrical communication with I/O pad 54. The via plug 68 can be suitably formed of a material such as aluminum, copper, aluminum alloy, copper alloy or silver. Other deposition methods for filling the via opening 66 may also be used. For instance, a screen printing method or a stencil printing method may be used to deposit an electrically conductive material into the via opening 66. After the via plug 68 is properly formed and planarized, the organic material layer 64 of a photoresist or a polymer may be removed by an etching method. This is shown in FIG. 2F.

Figure 2G:
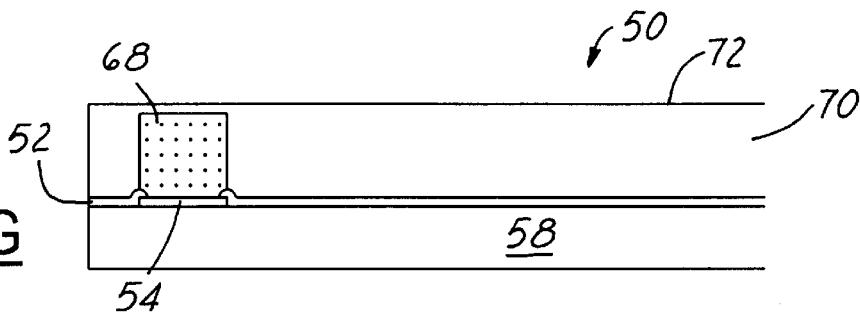
FIG. 2G is an enlarged, cross-sectional view of the present invention wafer of FIG. 2F with an elastomeric material layer coated on top.
Figure 2H:
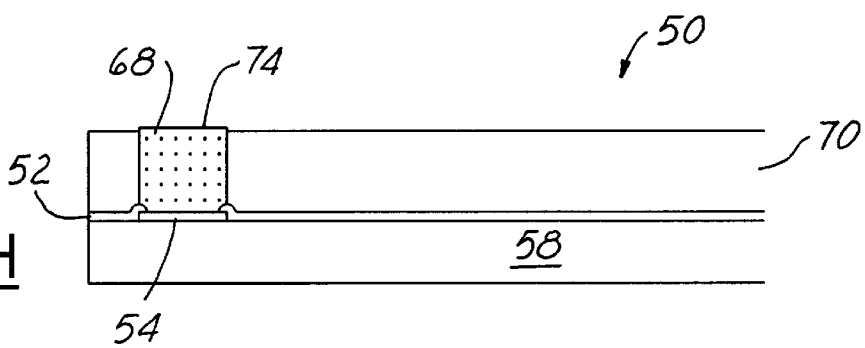
FIG. 2H is an enlarged, cross-sectional view of the present invention wafer of FIG. 2G with a via plug exposed after an etch back process.
Figure 2I:
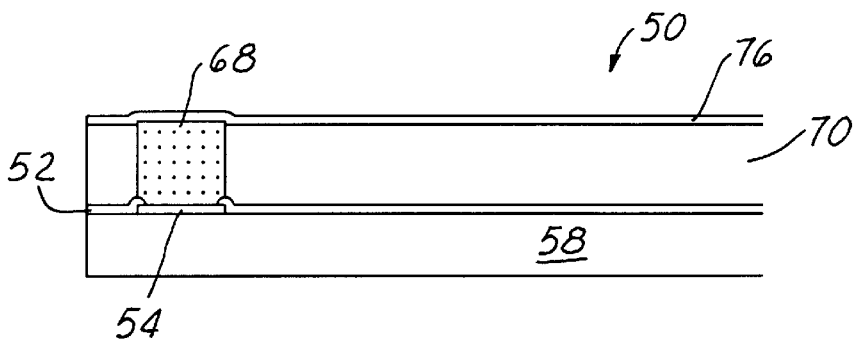
FIG. 2I is an enlarged, cross-sectional view of the present invention wafer of FIG. 2H after a thin metal conductive layer is deposited on top.
Figure 2J:
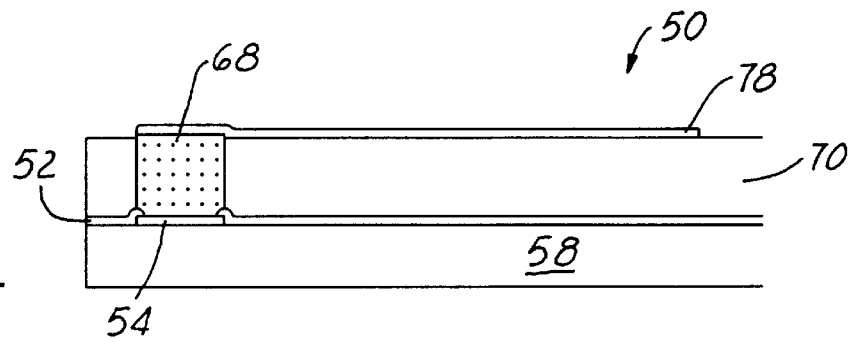
FIG. 2J is an enlarged, cross-sectional view of the present invention wafer of FIG. 2I after the thin conductive metal layer is patterned into metal traces.

An important step in the present invention novel method for forming metal traces on a stress-buffing layer is illustrated in FIG. 2G. A layer that has a thickness between about 25 $\mu$m and 150 $\mu$m of an elastic material is printed, coated or laminated on top of the wafer 50. The elastic material layer 70 can be suitably an elastromeric material such as a silicone rubber or a fluorosilicone rubber. After the elastic material layer 70 is properly annealed or cured, an etching process is conducted on the top surface 72 of the layer to remove a surface layer of the material and thus exposing the top surface 74 of the via plug 68. This is shown in FIG. 2H. In the next step of the process, a photolithographic technique is used to extend the I/O pad 54 from the peripheral of the IC dies to the center region of the die, i.e., to I/O pads arranged in an area array (not shown) for I/O redistribution. A conductive metal layer 76 is first deposited on top of the elastic material layer 70. For instance, a suitable technique for the deposition of a high conductivity metal such as copper or aluminum or UBM materials is sputtering. This is shown in FIGS. 2I and 2J. The metal conductive layer 76 is then etched in a conventional photolithographic method into a metal trace 78, as shown in FIG. 2J. The metal trace 78 extends itself by making electrical communication with the via plug 68 and the bond pad 54 to a center region of the IC die, and therefore communicates with an I/O pad in an area array.

Figure 2K:
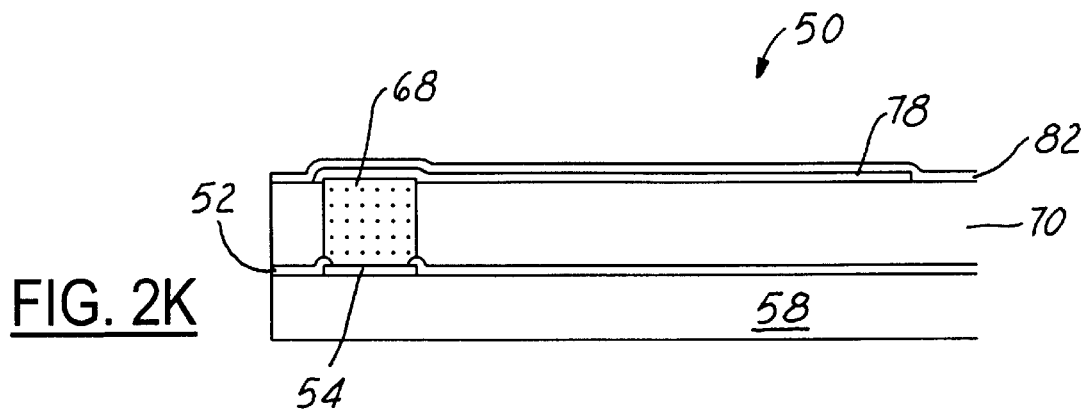
FIG. 2K is an enlarged, cross-sectional view of the present invention wafer of FIG. 2J after a dielectric material layer is blanket deposited on top.
Figure 2L:
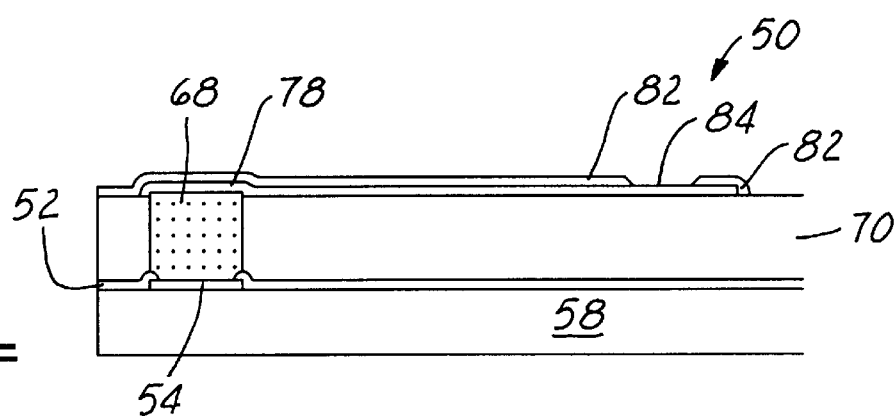
FIG. 2L is an enlarged, cross-sectional view of the present invention wafer of FIG. 2K after the dielectric layer is patterned and a second I/O bond pad is exposed on the metal trace.
Figure 2M:
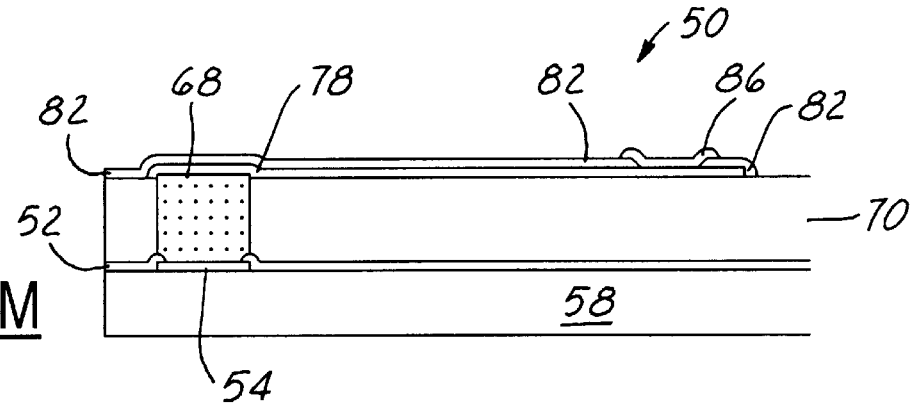
FIG. 2M is an enlarged, cross-sectional view of the present invention wafer of FIG. 2L after an under-bump-metallurgy layer is deposited and formed in the second I/O bond pad opening.

As shown in FIGS. 2K and 2L, after the metal trace 78 is formed, another dielectric layer 82 is blanket deposited on top of the wafer 50 to insulate the metal trace 78. The dielectric material 82 is then defined to expose a tail portion 84 of the metal trace 78 to function as a bond pad. It should be noted that the new bond pad 84 is most likely located at a center region of the IC die, i.e. as an I/O pad in an area array. A under-bump-metallurgy layer 86 is then deposited on top of the dielectric layer 82 and defined to only cover the bond pad 84 as shown in FIG. 2M. The UBM layer 86 can be suitably deposited by an electroless plating technique or by a thin film deposition technique.

Figure 2N:
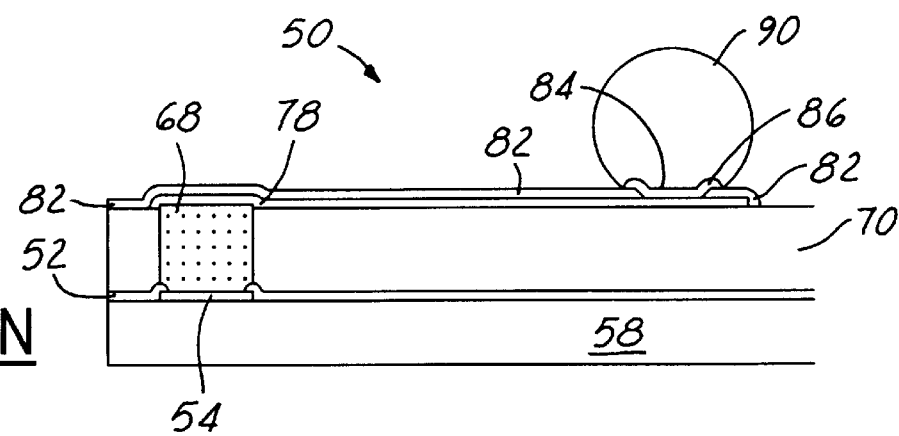
FIG. 2N is an enlarged, cross-sectional view of the present invention wafer of FIG. 2M after a solder ball is deposited and reflowed on the second I/O bond pad.

As shown in FIG. 2N, after the UBM layer 86 is properly formed, a solder bump (not shown) is first deposited by a plating technique or by any other suitable solder bump planting technique and then reflown into a solder ball 90. The present invention novel method therefore provides electrical communication between a peripheral array I/O pad 54 and an area array I/O pad 84 by using a metal trace 78 which is formed on top of an elastic material layer 70 functioning as a stress-buffer. The present invention novel method therefore enables the fabrication of a highly reliable IC chip that utilizes stress-buffered connections between the periphery of an IC chip and a center region of the IC chip.

It was observed that for the elastic material layer 70, the lower the Young's modulus of the elastic material used, the thinner of the material layer is required. However, when the Young's modulus is too low, the metal trace formed on top of the elastic material layer may break easily and cause reliability problems.

The present invention novel method and devices formed by such method have been amply demonstrated in the above descriptions and in the appended drawings of FIGS. 2A–2N. While the present invention has been described in terms of a preferred embodiment only, it is to be appreciated that those skilled in the art will readily apply these teachings to other possible variation of the invention.

The embodiment of the invention in which an exclusive property or privilege is claimed are defined as follows:

1. A method for forming a wafer level package comprising the steps of:

providing a silicon wafer having a multiplicity of IC dies formed on a top surface, each of said multiplicity of IC dies having at least one first I/O pad formed in a first insulating layer, forming at least one via plug of a first conductive metal substantially exposed on said at least one first I/O pad, coating a layer of second insulating material of sufficient elasticity on said top surface of the wafer with a top surface of said at least one via plug substantially exposed from said second insulating material layer, depositing a second conductive metal layer on top of said second insulating material layer, forming at least one metal trace with a first end electrically communicating with said at least one via plug and a second end extending away from said first end, depositing a third insulating material layer on top of said at least one metal trace, defining and exposing at least one second I/O pad at said second end of said at least one metal trace, and forming at least one solder ball on said at least one second I/O pad.

2. A method for forming a wafer level package according to clam 1, wherein said step of forming at least one solder ball further comprising:

depositing an under-bump-metallurgy layer on said at least one second I/O pad prior to forming said at least one solder ball.

3. A method for forming a wafer level package according to claim 2, wherein said step of forming at least one solder ball further comprising the steps of:

depositing an under-bump-metallurgy (UBM) layer on said at least one second I/O pad, depositing a fourth insulating material layer overlying said UBM layer, filling at least one via hole formed in said fourth insulating material layer on said at least one second I/O pad with a solder material forming at least one solder bump, removing said fourth insulating material layer, and reflowing said at least one solder bump into at least one solder ball.

4. A method for forming a wafer level package according to claim 3, wherein said at least one solder bump is formed in said at least one via hole by a technique selected from the group consisting of screen printing, stencil printing, electrodeposition, electroless deposition and pick and place solder ball.

5. A method for forming a wafer level package according to claim 1, wherein said second insulating material layer is formed of an elastomeric material.

6. A method for forming a wafer level package according to claim 1, wherein said second insulating material layer is formed of an elastic material having a Young's modulus of less than 20 MPa.

7. A method for forming a wafer level package according to claim 1, wherein said at least one first I/O pad is arranged in a peripheral array on said multiplicity of IC dies.

8. A method for forming a wafer level package according to claim 1, wherein said at least one second I/O pad is arranged in an area array on said multiplicity of IC dies.

9. A method for forming a wafer level package according to claim 1, wherein said at least one second I/O pad is arranged in an area sufficiently away from a periphery of said multiplicity of IC dies.

10. A method for forming a wafer level package according to claim 1, wherein said at least one via plug is formed by a photolithographic method.

11. A method for forming a wafer level package according to claim 1, wherein said at least one first I/O pad and said at least one second I/O pad are formed of Al or copper.

12. A method for forming a wafer level package according to claim 1, wherein said at least one via plug is formed of a material selected from the group consisting of Al, Cu, Al alloys and Cu alloys.

13. A method for forming a wafer level package according to claim 1, wherein said second conductive metal layer is formed of Al, Cu or UBM material.

14. A method for forming a wafer level package comprising the steps of:

providing a silicon wafer having a multiplicity of IC dies formed on a top surface, each of said multiplicity of IC dies having at least one I/O pad in a peripheral array formed in a first insulating layer, forming at least one via plug of a first conductive metal substantially exposed on said at least one I/O pad in said peripheral array, coating a layer of second insulating material having sufficient elasticity on said top surface of the wafer with a top surface of said at least one via plug substantially exposed from said layer of second insulating material, depositing a second conductive metal layer on top of said layer of second insulating material, forming at least one metal trace having a first end electrically communicating with said at least one via plug and a second end projecting away from said first end, depositing a layer of third insulating material on top of said at least one metal trace, defining and exposing at least one I/O pad in an area array in electrical communication with said second end of said at least one metal trace, and forming at least one solder ball on said at least one I/O pad in said area array.

15. A method for forming a wafer level package according to claim 14, wherein said step of forming at least one solder ball further comprising the step of depositing an under-bump-metallurgy layer on said at least one I/O pad in said area array prior to forming said at least one solder ball.

16. A method for forming a wafer level package according to claim 14 further comprising the step of coating said layer of second insulating material with an elastomeric material.

17. A method for forming a wafer level package according to claim 14 further comprising the step of forming said at least one I/O pad in said peripheral array and in said area array with Al or Cu.

18. A method for forming a wafer level package according to claim 14 further comprising the step of forming said at least one via plug from a material selected from the group consisting of Al, Cu, Al alloys and Cu alloys.

* * * * *